United States Patent
Choi et al.

(10) Patent No.: US 9,627,584 B2
(45) Date of Patent: Apr. 18, 2017

(54) LIGHT EMITTING DEVICE AND LIGHT EMITTING DEVICE PACKAGE

(71) Applicant: LG INNOTEK CO., LTD., Seoul (KR)

(72) Inventors: Young Jae Choi, Seoul (KR); Jae Hoon Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/330,465

(22) Filed: Jul. 14, 2014

(65) Prior Publication Data

US 2015/0014724 A1    Jan. 15, 2015

(30) Foreign Application Priority Data

Jul. 15, 2013    (KR) .................. 10-2013-0082691

(51) Int. Cl.
*H01L 33/50* (2010.01)
*H01L 33/40* (2010.01)
*H01L 33/64* (2010.01)

(52) U.S. Cl.
CPC ............ *H01L 33/40* (2013.01); *H01L 33/501* (2013.01); *H01L 33/504* (2013.01); *H01L 33/641* (2013.01)

(58) Field of Classification Search
CPC ....... H01L 33/40; H01L 33/405; H01L 33/50; H01L 33/501; H01L 33/502; H01L 33/504; H01L 33/46; H01L 33/505
See application file for complete search history.

(56) References Cited

U.S. PATENT DOCUMENTS

| | | | |
|---|---|---|---|
| 6,501,091 B1 | 12/2002 | Bawendi et al. | |
| 2001/0004112 A1 | 6/2001 | Furukawa et al. | |
| 2006/0113895 A1 | 6/2006 | Baroky et al. | |
| 2007/0080361 A1 | 4/2007 | Malm | |
| 2007/0228931 A1 | 10/2007 | Kim et al. | |
| 2011/0284896 A1* | 11/2011 | Park | 257/98 |
| 2013/0228813 A1 | 9/2013 | Jo et al. | |
| 2013/0341636 A1* | 12/2013 | Okuno | 257/76 |
| 2014/0151632 A1 | 6/2014 | Li et al. | |
| 2014/0339588 A1 | 11/2014 | Park | |

FOREIGN PATENT DOCUMENTS

| | | |
|---|---|---|
| EP | 1 111 689 A2 | 6/2001 |
| EP | 2 360 749 A2 | 8/2011 |
| EP | 2 388 839 A2 | 11/2011 |
| JP | 2002-164576 A | 6/2002 |
| JP | 2008-098486 A | 4/2008 |
| WO | WO 02/29906 A2 | 4/2002 |
| WO | WO 2012/163130 A1 | 12/2012 |

OTHER PUBLICATIONS

European Search Report dated Dec. 18, 2014 issued in Application No. 14 176 318.5.

* cited by examiner

*Primary Examiner* — Yu Chen

(74) *Attorney, Agent, or Firm* — KED & Associates LLP

(57) ABSTRACT

A light emitting device includes a light emitting structure including a plurality of compound semiconductor layers. A current spreading layer is provided under the light emitting structure, and a plurality of wavelength conversion structures is provided in the current spreading layer. An electrode layer is provided under the current spreading layer, and an electrode is provided on the light emitting structure.

19 Claims, 11 Drawing Sheets

LIGHT EMITTING DEVICE AND LIGHT EMITTING DEVICE PACKAGE

CROSS-REFERENCE TO RELATED APPLICATION

This application claims under 35 U.S.C. §119 to Korean Patent Application No. 10-2013-0082691 (filed Jul. 15, 2013), which is hereby incorporated by reference in its entirety.

BACKGROUND

1. Field

The embodiment relates to a light emitting device.

2. Background

The embodiment relates to a light emitting device package.

Studies and researches on a light emitting device and a light emitting device package have been actively carried out.

The light emitting device is a semiconductor light emitting device or a semiconductor light emitting diode formed of a semiconductor material to convert electrical energy into light.

In comparison with other light sources such as a fluorescent lamp and an incandescent lamp, the LED is advantageous because of low power consumption, a long lifetime, a fast response time, safety, and environment-friendliness. Accordingly, many studies and researches to substitute the existing light sources with the light emitting diode have been performed.

In addition, light emitting devices are increasingly used as light sources of a variety of lamps used in indoor and outdoor places, a backlight unit of a liquid crystal display, a display device such as an electronic display board, and a lighting device such as a streetlamp.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of embodiments, it will be understood that when an element is referred to as being 'on (under) or under (on)' another element, it can be directly on another element or at least one intervening element may also be present. Further, when it is expressed as 'upward (downward) or downward (upward)', it may include the upward direction as well as the downward direction on the basis of one element.

Figure 1:
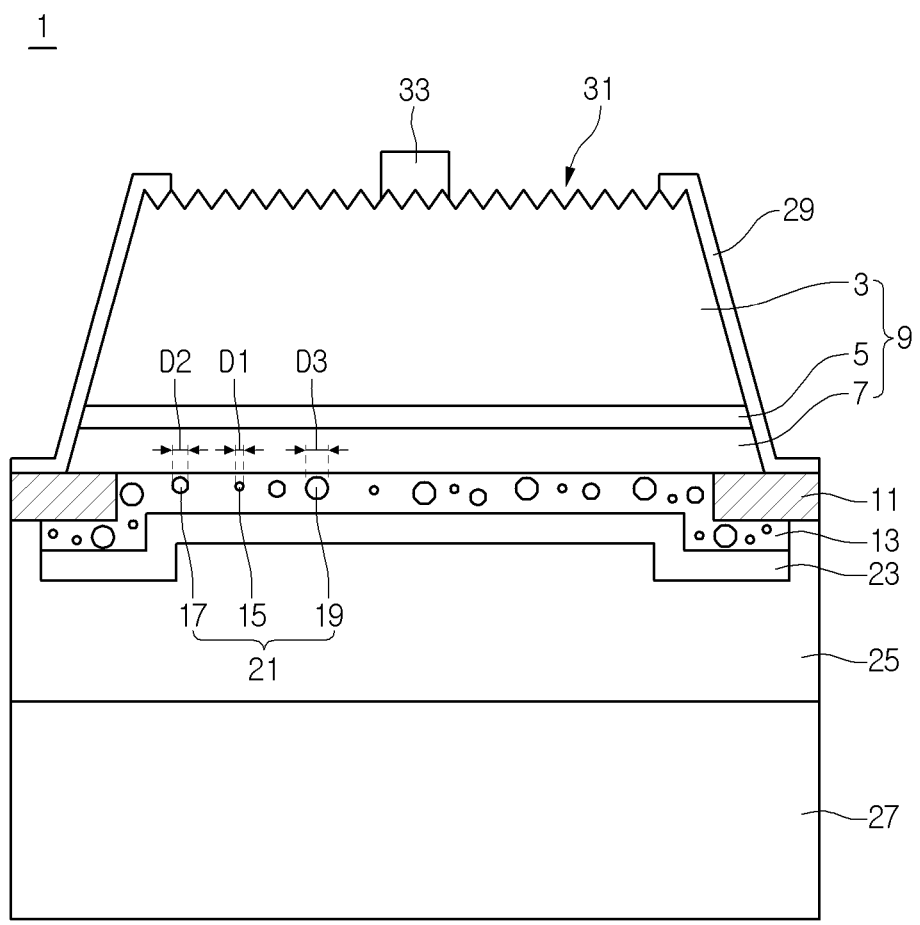
FIG. 1 is a sectional view showing a light emitting device according to a first embodiment.

FIG. 1 is a sectional view showing a light emitting device according to a first embodiment. Referring to FIG. 1, the light emitting device 1 according to the first embodiment may include an electrode layer 23, a current spreading layer 13, a light emitting structure 9 and an electrode 33. The light emitting device 1 according to the first embodiment may be a vertical type light emitting device. The light emitting device 1 according to the first embodiment may further include a wavelength conversion structure 21 capable of generating light having mutually different wavelengths.

The light emitting device 1 according to the first embodiment may further include an adhesive layer 25 and a support member 27 disposed under the electrode layer 23. The light emitting device 1 according to the first embodiment may further include a protective layer 29 that surrounds the light emitting structure 9.

The light emitting structure 9 may include a plurality of compound semiconductor layers. The light emitting structure 9 may include at least a first conductive semiconductor layer 3, an active layer 5 and a second conductive semiconductor layer 7. The first conductive semiconductor layer 3 may be disposed under the electrode 33. The active layer 5 may be disposed under the first conductive semiconductor layer 3. The second conductive semiconductor layer 7 may be disposed under the active layer 5.

The first conductive semiconductor layer 3 and the second conductive semiconductor layer 7 may include dopant. The active layer 5 may include dopant or not. The dopant of the first conductive semiconductor layer 3 may have polarity opposite to that of the dopant of the second conductive semiconductor layer 7. For instance, the first conductive semiconductor layer 3 may include n type dopant and the second conductive semiconductor layer 7 may include p type dopant, but the embodiment is not limited thereto. The n type dopant may include at least one of Si, Ge, Sn, Se and Te and the p type dopant may include at least one of Mg, Zn, Ca, Sr, and Ba, but the embodiment is not limited thereto.

For example, the first conductive semiconductor layer 3 may generate first carriers, that is, electrons to provide the electrons to the active layer 5 and the second conductive semiconductor layer 7 may generate second carriers, that is, holes to provide the holes to the active layer 5.

The electrons from the first conductive semiconductor layer 3 and the holes from the second conductive semiconductor layer 7 may be recombined in the active layer 5. Due to the recombination of the electrons and holes, light having a wavelength corresponding to the energy band gap determined according to a material constituting the active layer 5 can be emitted.

The active layer 5 may include one of single quantum well (SQW) structure, a multi quantum well (MQW) structure, a quantum dot structure, and a quantum wire structure. The active layer 5 may be formed by repeatedly laminating well layers and barrier layers at a cycle of the well layer and the barrier layer. The repetition cycle of the well and barrier layers may vary depending on the characteristics of the light emitting device 1, and the embodiment is not limited thereto. For example, the active layer 5 may include one of a cycle of InGaN/GaN, a cycle of InGaN/AGaN, and a cycle of InGaN/InGaN. The active layer 5 may generate one of ultraviolet ray, visible ray and infrared ray.

Another compound semiconductor layer may be disposed under the first conductive semiconductor layer 3 or on the second conductive semiconductor layer 7 in the form of a single layer or a multi-layer, but the embodiment is not limited thereto.

The current spreading layer 13 may be disposed under the second conductive semiconductor layer 7 of the light emitting structure 9. The current spreading layer 13 may be a graphene layer or a graphene sheet including graphene, but the embodiment is not limited thereto. The current spreading layer 13 may make contact with a bottom surface of the second conductive semiconductor layer 7 of the light emitting structure 9 to allow current to be readily supplied to the second conductive semiconductor layer 7 of the light emitting structure 9.

Graphite has a structure obtained by stacking carbons in the form of a hexagonal honeycomb. The graphene may signify a layer delaminated from the graphite as thin as possible. The graphene is a carbon allotrope and includes a nano material consisting of carbons having an atomic number of 6, such as carbon nanotube or fullerene. The graphene has a 2-dimensional planar shape and a very thin thickness of about 0.2 nm with high physical and chemical stability. The graphene has electric conductivity 100 times higher than that of copper and thermal conductivity two times higher than that of diamond.

The current spreading layer 13 according to the first embodiment may include a graphene sheet obtained by laminating the graphene. Thus, the current may rapidly spread over the whole area of the current spreading layer 13 so that the current can be uniformly distributed to the second conductive semiconductor layer 7 making contact with the whole area of the current spreading layer 13. In addition, the current spreading layer 13 may rapidly dissipate heat generated from the light emitting structure 9 to the outside.

A plurality of wavelength conversion structures 21 may be disposed in the current spreading layer 13. The wavelength conversion structures 21 may be confined in the current spreading layer 13, but the embodiment is not limited thereto. The wavelength conversion structures 21 may be surrounded by the current spreading layer 13. The wavelength conversion structures 21 may be prepared in the form of spherical balls, but the embodiment is not limited thereto. The wavelength conversion structures 21 may have diameters in the range of few Å to several hundreds of nanometers, but the embodiment is not limited thereto.

Figure 2:
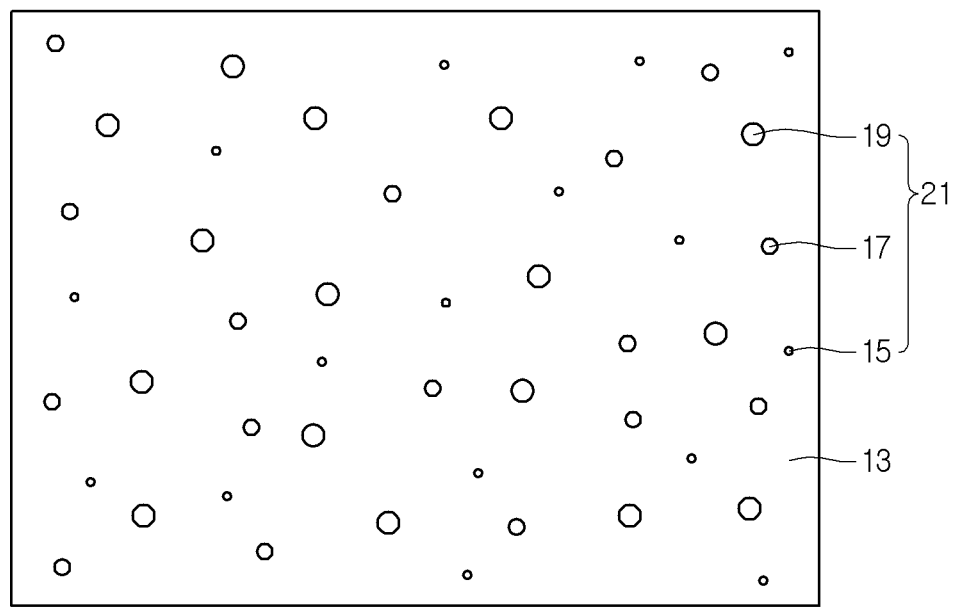
FIG. 2 is a plan view showing a current spreading layer and a wavelength conversion layer.

As shown in FIG. 2, the wavelength conversion structures 21 may have mutually different diameters. For instance, the wavelength conversion structures 21 may include first wavelength conversion structures 15 having first diameters D1, second wavelength conversion structures 17 having second diameters D2, and third wavelength conversion structures 19 having third diameters D3, but the embodiment is not limited thereto. The second diameter D2 may be larger than the first diameter D1 and the third diameter D3 may be larger than the second diameter D2.

The wavelength conversion structures 21 may consist of homogeneous material or heterogeneous material, and the embodiment is not limited thereto. The wavelength conversion structures 21 may include one of CdSe, CdSe/ZnS, CdTe/CdS, PbS and PuSe, but the embodiment is not limited thereto. The wavelength conversion structures 21 may include a plurality of quantum dots. That is, the wavelength conversion structures 21 may be nano-cluster prepared by collecting several tens to several thousand of atoms or molecules, but the embodiment is not limited thereto.

For example, the wavelength conversion structures 21 may include CdSe capable of converting light to have a wavelength of 466 nm to 640 nm. The wavelength conversion structures 21 including the CdSe may have a diameter of 1.9 nm to 6.7 nm, but the embodiment is not limited thereto.

For example, the wavelength conversion structures 21 may include CdSe/ZnS capable of converting light to have a wavelength of 490 nm to 620 nm. The wavelength conversion structures 21 including the CdSe/ZnS may have a diameter of 2.9 nm to 6.1 nm, but the embodiment is not limited thereto.

For example, the wavelength conversion structures 21 may include CdTe/CdS capable of converting light to have a wavelength of 620 nm to 660 nm. The wavelength conversion structures 21 including the CdTe/CdS may have a diameter of 3.7 nm to 4.8 nm, but the embodiment is not limited thereto.

Figure 3:
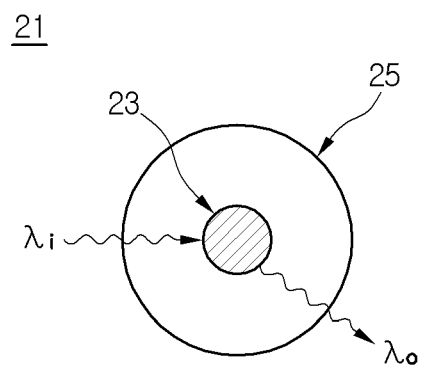
FIG. 3 is a view showing a wavelength that varies depending on a size of a wavelength conversion structure.

As shown in FIG. 3, the wavelength conversion structures 21 including the CdSe/ZnS or the CdTe/CdS may have a structure of a core 23 and a shell 25. In this case, the core 23 may include CdSe or CdTe and the shell 25 may include ZnS or CdS, but the embodiment is not limited thereto. The core 23 may consist of CdSe molecules or CdTe molecules and the shell 25 may consist of ZnS molecules or CdS molecules.

For example, the wavelength conversion structures 21 may include PbS capable of converting light to have a wavelength of 850 nm to 2100 nm. The wavelength conversion structures 21 including the PbS may have a diameter of 2.3 nm to 2.9 nm, but the embodiment is not limited thereto. The core 23 and/or the shell 25 may be a spherical ball, but the embodiment is not limited thereto.

If light having a wavelength $\lambda i$ is incident into the wavelength conversion structures 21, the light having the wavelength $\lambda i$ may be absorbed in the core 23 and then light converted to have a wavelength of $\lambda o$ may be emitted. The light having the wavelength of $\lambda o$ may be determined according to the material and diameter of the core 23.

Figure 4:
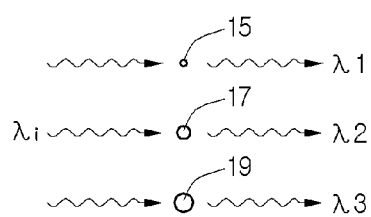
FIG. 4 is a view showing a wavelength conversion structure.

As shown in FIG. 4, light having mutually different wavelengths may be generated depending on the size of the diameter of the wavelength conversion structures 21. For instance, the wavelength conversion structures 15 having the first diameter D1 may convert the light having the wavelength $\lambda$ into the light having the first wavelength $\lambda 1$. In addition, the wavelength conversion structures 17 having the second diameter D2 may convert the light having the wavelength $\lambda$ into the light having the second wavelength $\lambda 2$. Further, the wavelength conversion structures 19 having the third diameter D3 may convert the light having the wavelength $\lambda$ into the light having the third wavelength $\lambda 3$.

Figure 5:
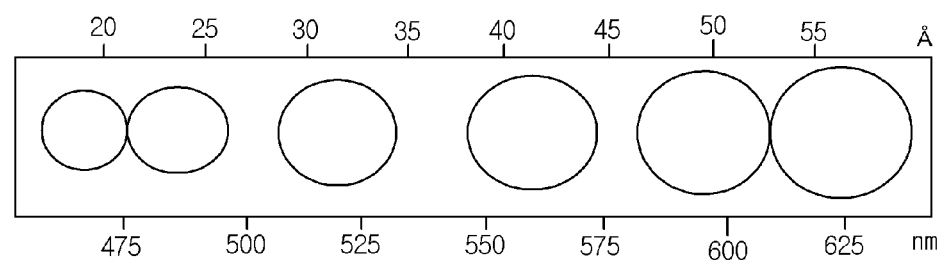
FIG. 5 is a view showing a wavelength band range according to a size of a wavelength conversion structure.

As shown in FIG. 5, for example, if ultraviolet ray generated from the light emitting structure 9 is incident into the wavelength conversion structures 21, the ultraviolet ray may be converted into light having a wavelength, as shown in FIG. 5, by the wavelength conversion structures 15 having a diameter of 17 Å to 20 Å. In addition, the ultraviolet ray may be converted into light having a wavelength, as shown in FIG. 5, by the wavelength conversion structures 17 having a diameter of 21 Å to 25 Å. Further, the ultraviolet ray may be converted into light having a wavelength, as shown in FIG. 5, by the wavelength conversion structures 19 having a diameter of 52 Å to 58 Å. As a result, the light emitting device 1 may generate all of light having a blue wavelength, light having a green wavelength, and light having a red wavelength, so that white light can be obtained.

The embodiment does not use an additional phosphor, so the color rendering index (CRI) can be improved. In addition, according to the embodiment, an occupying area of the light emitting device can be reduced as compared with the light emitting device according to the related art which generates one light, and the manufacturing cost can be reduced.

A channel layer 11 may be disposed under a peripheral region of the light emitting structure 9. The channel layer 11 may be disposed between the peripheral region of the light emitting structure 9 and a peripheral region of the current spreading layer 13. The channel layer 11 has a role of increasing an interval between the electrode layer 23 and the active layer 5 to prevent electric short between the current spreading layer 13 and the active layer 5 or the first conductive semiconductor layer 3 of the light emitting structure 9.

The channel layer 11 may have a closed-loop structure or an open-loop structure extending along the peripheral region of the light emitting structure 9. The channel layer 11 may include a transparent material. For instance, the channel layer 11 may include at least one selected from the group consisting of SiO2, SiOx, SiOxNy, Si3N4, and Al2O3.

An end portion of the current spreading layer 13 may overlap with a portion of a bottom surface of the channel layer 11. Although not shown, the end portion of the current spreading layer 13 may not overlap with the channel layer 11, but the embodiment is not limited thereto. The end portion of the current spreading layer 13 may come into contact with an inner side of the channel layer 11, but the embodiment is not limited thereto.

The electrode layer 23 may be disposed under the current spreading layer 13. The electrode layer 23 may have an area equal to an area of the current spreading layer 13, but the embodiment is not limited thereto. The electrode layer 23 may be an electrode having superior electric conductivity. The electrode may include at least one selected from the group consisting of Au, Ti, Ni, Cu, Al, Cr, Ag and Pt. The electrode layer 23 may have a single layer structure or a multi-layer structure.

The electrode layer 23 may be a reflective layer to reflect light generated from the light emitting structure 9. The reflective layer may include at least one or two selected from the group consisting of Ag, Ni, Al, Rh, Pd, Ir, Ru, Mg, Zn, Pt, Au and Hf, but the embodiment is not limited thereto. The electrode layer 23 may include at least one of the electrode and the reflective layer.

The electrode layer 23 may have an area larger than an area of the light emitting structure 9, in detail, the active layer 5 of the light emitting structure 9, but the embodiment is not limited thereto. If the electrode layer 23 has an area larger than an area of the active layer 5, the light slantingly travelling from the active layer 5 can be reflected so that the light extraction efficiency can be improved.

The current spreading layer 13 and the electrode layer 23 may be buried in the adhesive layer 25 so that the current spreading layer 13 and the electrode layer 23 may not be exposed to the outside. That is, the adhesive layer 25 may surround the current spreading layer 13 and the electrode layer 23 while making contact with the bottom surface of the channel layer 11. For example, the adhesive layer 25 may include a central region having a recess and a peripheral region protruding upward. The electrode layer 23 and the adhesive layer 25 may be disposed in the recess of the central region and the top surface of the peripheral region may come into contact with the bottom surface of the channel layer 11.

A support member 27 may be disposed under the adhesive layer 25. The adhesive layer 25 may include a material allowing the support member 27 to be easily bonded to the electrode layer 23. For instance, the adhesive layer 25 may include at least one selected from the group consisting of Ti, Au, Sn, Ni, Nb, Cr, Ga, In, Bi, Cu, Ag and Ta.

The support member 27 may support a plurality of layers formed on the support member 27. The support member 27 may be a conductive support substrate having conductivity. The support member 27 may include a metal or a metal alloy. For instance, the support member 27 may include at least one selected from the group consisting of Ti, Cr, Ni, Al, Pt, Au, W, Cu, Mo and Cu—W.

The light emitting structure 9 may be formed thereon with a protective layer 29. For instance, the protective layer 29 may be formed on at least a lateral side of the light emitting structure 9. The protective layer 29 may prevent electrical short between the light emitting structure 9 and the support member 27 and protect the light emitting structure 9 from external shock. The protective layer 29 may include a material representing superior transparency and a superior insulating property. For instance, the protective layer 29 may include a material the same as a material constituting the channel layer 11, but the embodiment is not limited thereto.

A light extracting structure 31 may be formed on a top surface of the first conductive semiconductor layer 3 to improve the light extraction efficiency. The light extracting structure 31 may have a roughness or a convex-concavo structure. The electrode 33 may be formed on a portion of a top surface of the first conductive semiconductor layer 3 of the light emitting structure 9. The electrode 33 may include at least one selected from the group consisting of Au, Ti, Ni, Cu, Al, Cr, Ag and Pt.

If the electrode 33 is made from an opaque metallic material, the light extraction may be interrupted by the electrode 33. Thus, the electrode 33 having a pattern shape may be formed on a portion of the top surface of the first conductive semiconductor layer 3. In this case, current may be concentrated on the light emitting structure 9 disposed between the electrode 33 and a portion of the electrode layer 23 perpendicular to the electrode 33 so that the light may be actively generated. However, current may not flow to the light emitting structure 9 disposed between a region where the electrode 33 is not formed and the remaining region of the electrode layer 23, so that the light may be rarely generated. In other words, the light may not be uniformly generated over the whole area of the light emitting structure 9.

In order to solve the above problem, although not shown, a current blocking layer may be formed under the second conductive semiconductor layer 7 perpendicularly corresponding to the electrode 33. The current blocking layer may be disposed between the second conductive semiconductor layer 7 and the current spreading layer 13 or between the current spreading layer 13 and the electrode layer 23. The current blocking layer may include an insulating material or a material having low electric conductivity. Current may be blocked by the current blocking layer, so that intensity of current flowing through the light emitting structure 9, which is disposed perpendicularly corresponding to the electrode 33, may be reduced and intensity of current flowing through the light emitting structure 9, which is disposed in the region where the electrode 33 is not formed, may be increased. Thus, the current may uniformly flow in the vertical direction over the whole area of the light emitting structure 9 so that the light may be uniformly generated from the whole area of the light emitting structure.

Figure 6:
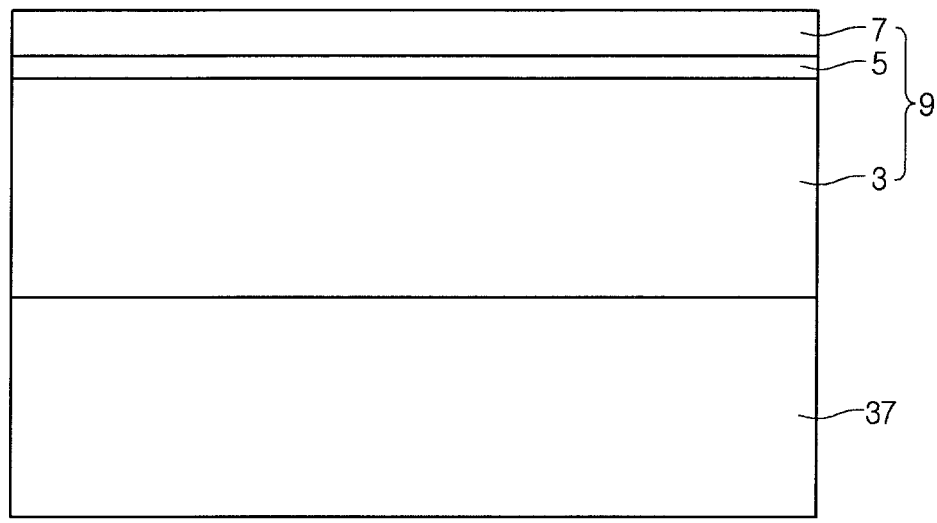
FIGS. 6-10B are views showing processes for manufacturing a light emitting device according to a first embodiment.

FIGS. 6 to 10B show processes for manufacturing the light emitting structure according to the first embodiment. Referring to FIG. 6, the light emitting structure 9 may be grown on a growth substrate 37. The light emitting structure 9 may include a plurality of compound semiconductor layers. The light emitting structure 9 may include at least the first conductive semiconductor layer 3, the active layer 5 and the second conductive semiconductor layer 7.

The first conductive semiconductor layer 3, the active layer 5 and the second conductive semiconductor layer 7 may be formed through one of MOCVD (Metal Organic Chemical Vapor Deposition), CVD (Chemical Vapor Deposition), PECVD (Plasma-Enhanced Chemical Vapor Deposition), MBE (Molecular Beam Epitaxy) and HVPE (Hydride Vapor Phase Epitaxy), but the embodiment is not limited thereto.

The first conductive semiconductor layer 3 may be an n type semiconductor layer including n type dopant and the second conductive semiconductor layer 7 may be a p type semiconductor layer including p type dopant, but the embodiment is not limited thereto.

Figure 7:
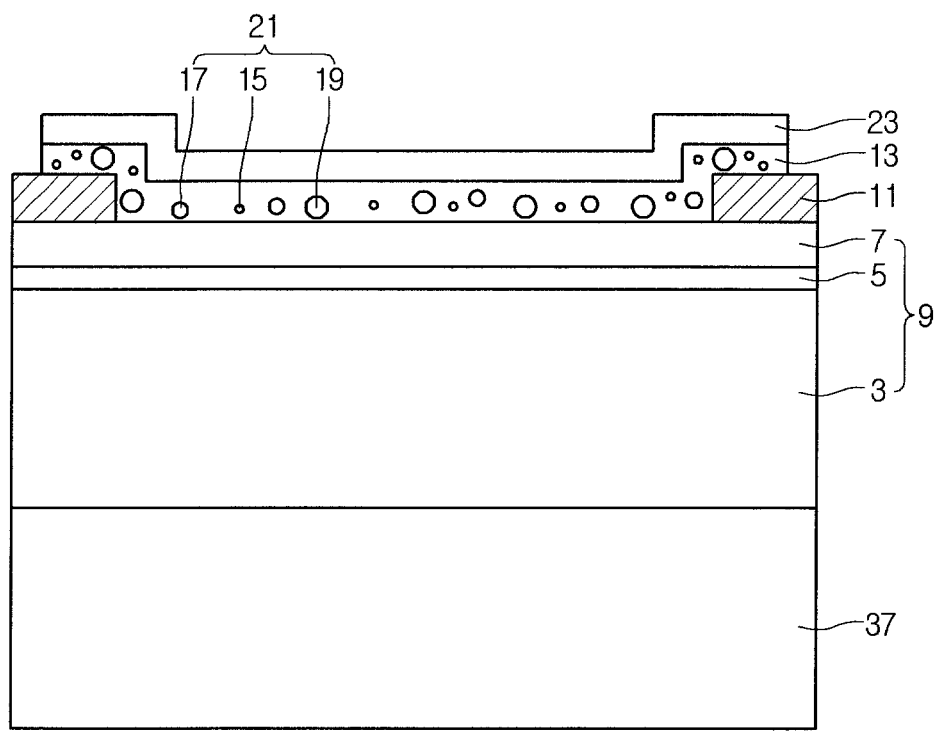

Referring to FIG. 7, the channel layer 11 may be formed on a peripheral region of the second conductive semiconductor layer 7. The channel layer 11 may be formed by patterning an insulating layer formed by depositing a transparent insulating material on the peripheral region of the second conductive semiconductor layer 7, but the embodiment is not limited thereto. The current spreading layer 13 and the electrode layer 23 may be formed on a central region of the second conductive semiconductor layer 7.

A plurality of wavelength conversion structures 21 may be formed in the current spreading layer 13. The current spreading layer 13 may be formed by surrounding the wavelength conversion structures 21 using a graphene sheet consisting of a plurality of graphene, cutting the graphene sheet into a desired size, and attaching the graphene sheet to the central region of the second conductive semiconductor layer 7. That is, the current spreading layer 13 may be formed by attaching the pre-processed graphene sheet onto the central region of the second conductive semiconductor layer 7.

A metal layer may be formed on the current spreading layer 13 and the electrode layer 23 may be formed by patterning the metal layer.

Figure 8:
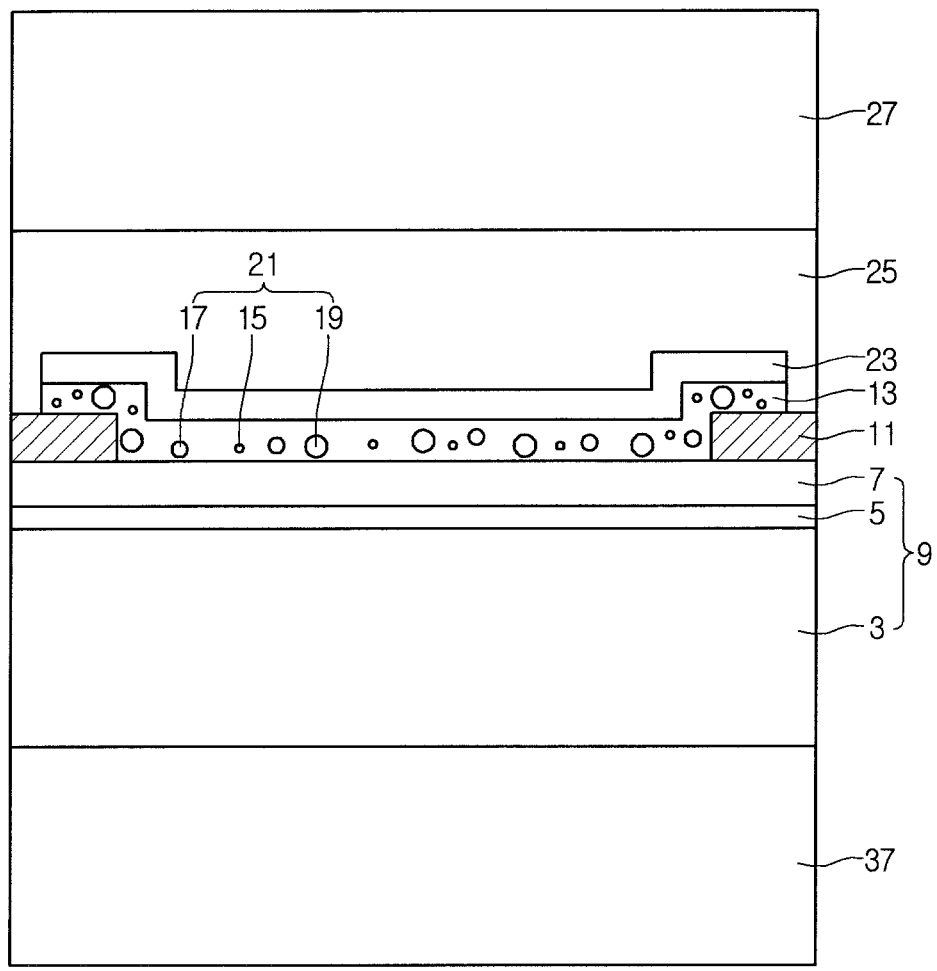

Referring to FIG. 8, the adhesive layer 25 may be formed on the electrode layer 23 and the channel layer 11 and the support member 27 may be formed on the adhesive layer 25. It is also possible to bond the adhesive layer 25 to the electrode layer 23 and the channel layer 11 after the adhesive layer 25 has been formed on the support member, but the embodiment is not limited thereto.

Figure 9A:
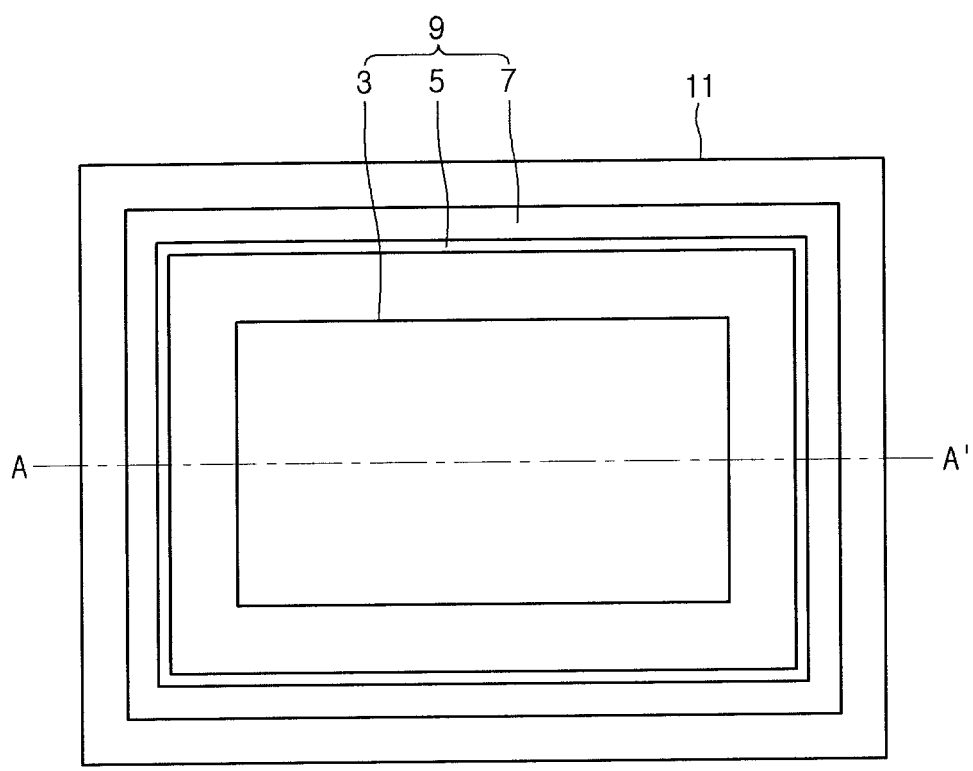
Figure 9B:
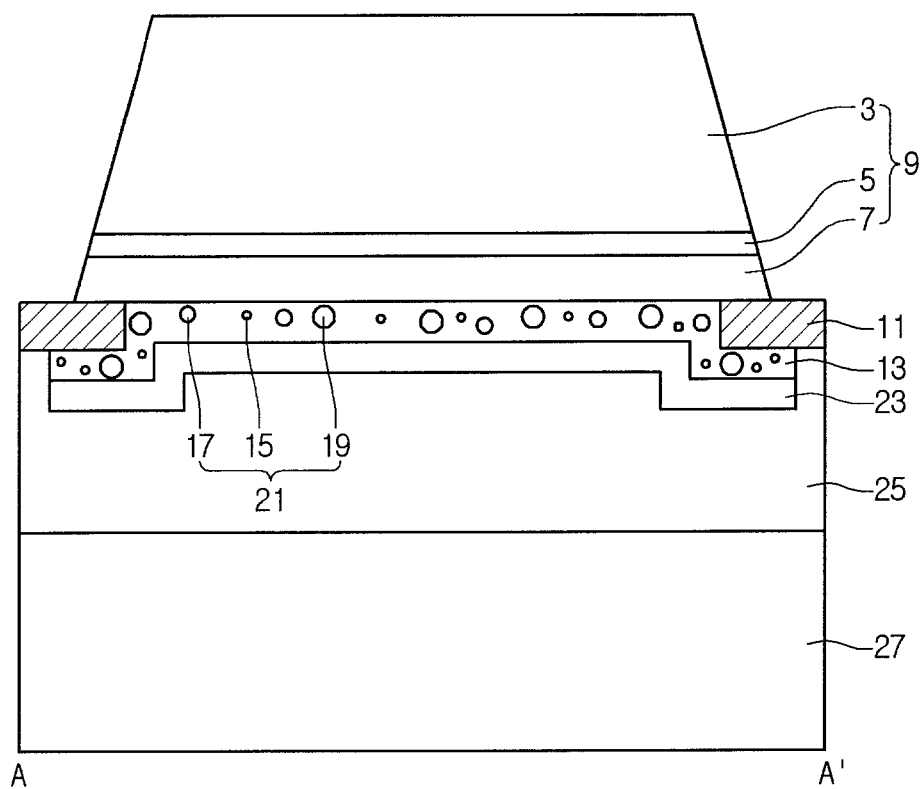

Referring to FIGS. 9A and 9B, the growth substrate 37 may be turned over and then removed. The growth substrate 37 may be removed through a chemical mechanical polishing process, a laser process or a lift off process.

A mesa etching may be performed with respect to the light emitting structure 9 to remove the peripheral region of the light emitting structure 9. As the light emitting structure 9 is removed, the top surface of the channel layer 11 may be partially exposed to the outside. Lateral sides of the light emitting structure 9 may be inclined. The light emitting structure 9 may have a size gradually increased downward. The active layer 5 may have a size smaller than a size of the first conductive semiconductor layer 3 and larger than the second conductive semiconductor layer 7.

Figure 10A:
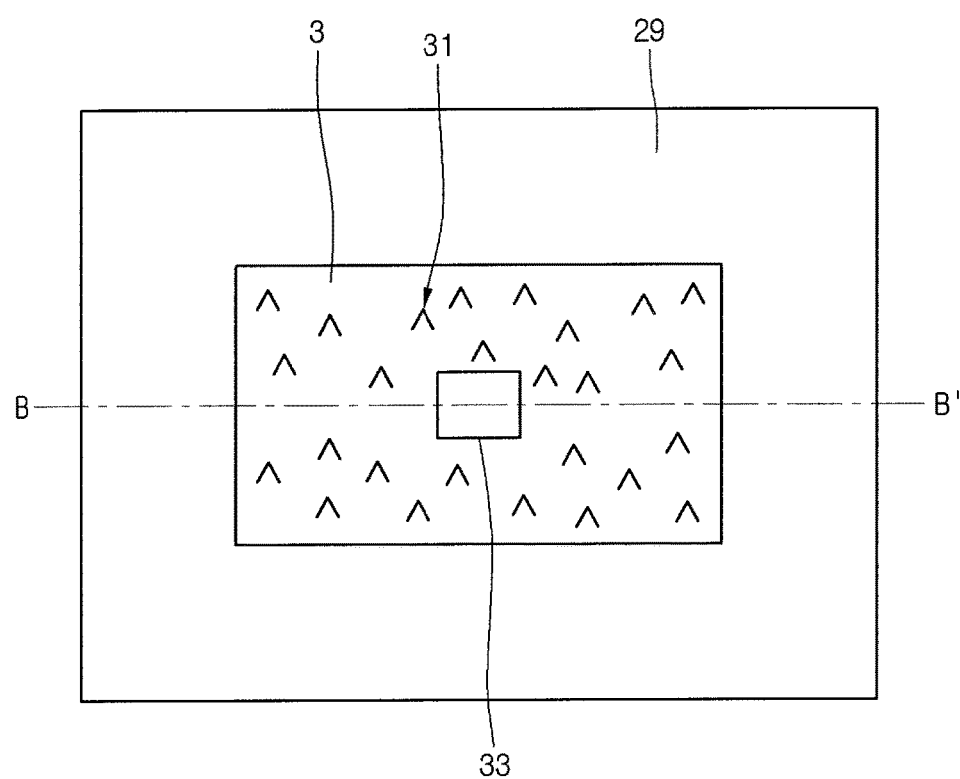
Figure 10B:
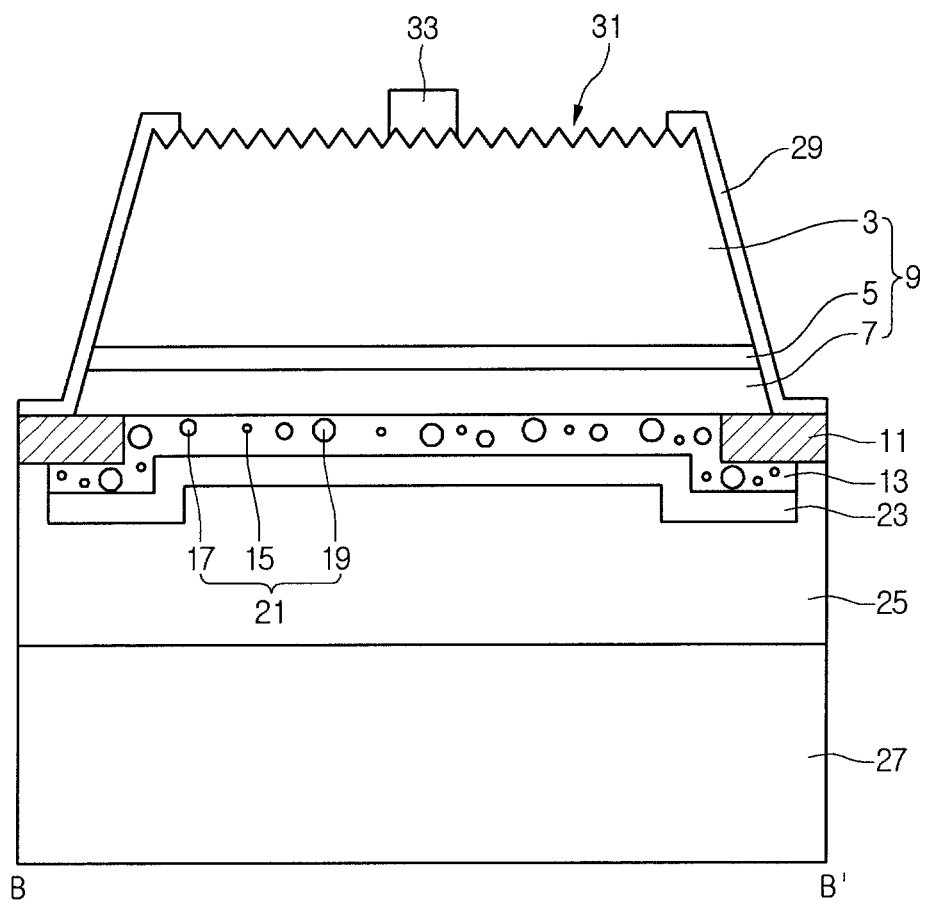

Referring to FIGS. 10A and 10B, the protective layer 29 may be formed on the lateral side of the light emitting structure 9. The protective layer 29 may be further formed on a top surface of the channel layer 11 and/or a portion of the peripheral region of the first conductive semiconductor layer 3, but the embodiment is not limited thereto. The protective layer 29 may be formed by depositing a transparent insulating material on the lateral side of the light emitting structure 9, the top surface of the channel layer 11 and/or a portion of the peripheral region of the first conductive semiconductor layer 3. Otherwise, the protective layer 29 may be formed by removing an insulating layer corresponding to the central region of the first conductive semiconductor layer 3 after forming the insulating layer by depositing the transparent insulating material on the top surface of the channel layer 11 and/or the whole area of the first conductive semiconductor layer 3.

The light extracting structure 31 may be formed by etching the central region of the first conductive semiconductor layer 3. The electrode 33 may be formed by patterning the metal layer formed on the central region of the first conductive semiconductor layer 3. The light emitting device according to the first embodiment may be manufactured through the above processes.

Figure 11:
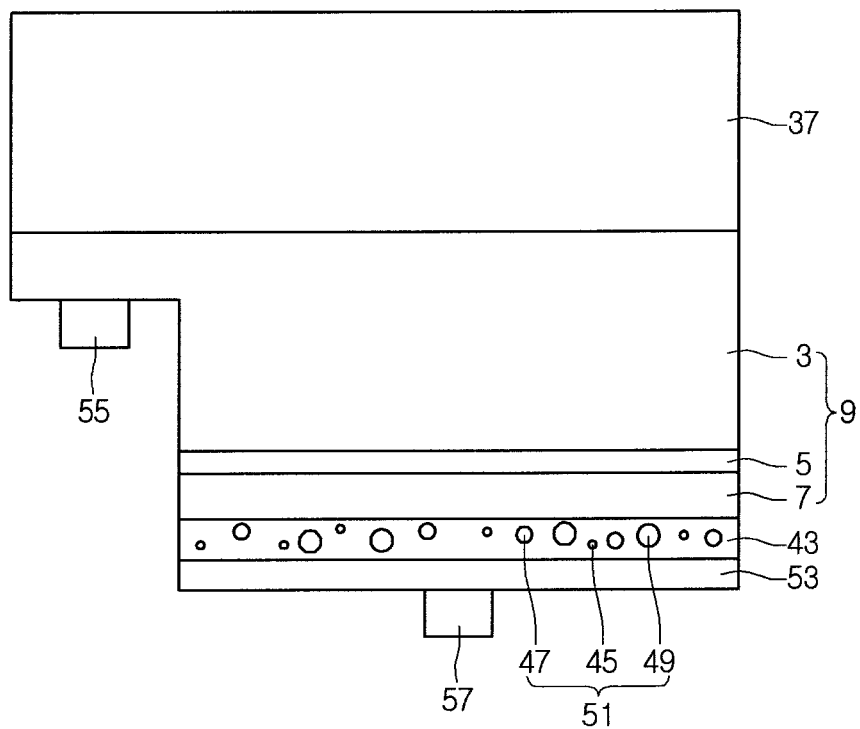
FIG. 11 is a sectional view showing a light emitting device according to a second embodiment.

FIG. 11 is a sectional view showing a light emitting device according to a second embodiment. The light emitting device 1A according to the second embodiment may be a flip-chip type light emitting device. Referring to FIG. 11, the light emitting device 1A according to the second embodiment may include a growth substrate 37, a light emitting structure 9, a current spreading layer 43, a plurality of wavelength conversion structures 51, an electrode layer 53 and first and second electrodes 55 and 57. Although not shown, the light emitting device 1A according to the second embodiment may further include a buffer layer disposed between the growth substrate 37 and the light emitting structure 9, but the embodiment is not limited thereto.

The buffer layer and the light emitting structure 9 may include group II-VI or III-V compound semiconductors having a compositional formula of $Al_xIn_yGa_{(1-x-y)}N$ (where $0<x<1$, $0<y<1$, and $0<x+y<<1$). For instance, the buffer layer and the light emitting structure 9 may include at least one selected from the group consisting of InAlGaN, GaN, AlGaN, InGaN, AlN, InN and AlInN, but the embodiment is not limited thereto.

The growth substrate 37 may grow the light emitting structure 9. In addition, the growth substrate 37 may support layers disposed under the growth substrate 37, for instance, the light emitting structure 9. Thus, the material for the growth substrate 37 may be selected by taking into consideration the thermal expansion rate, lattice constant and support strength with respect to the light emitting structure 9. The growth substrate 37 may be used as an electrode layer, but the embodiment is not limited thereto.

The light emitting structure 9 may be disposed under the growth substrate 37 or the buffer layer. The light emitting structure 9 may include a plurality of compound semiconductor layers. The light emitting structure 9 may include at least the first conductive semiconductor layer 3, the active layer 5 and the second conductive semiconductor layer 7.

The first conductive semiconductor layer 3 may be disposed under the growth substrate 37 or the buffer layer. The active layer 5 may be disposed under the first conductive semiconductor layer 3. The second conductive semiconductor layer 7 may be disposed under the active layer 5. The first conductive semiconductor layer 3 and the second conductive semiconductor layer 7 may include dopant. The active layer 5 may include dopant or not. The dopant of the first conductive semiconductor layer 3 may have polarity opposite to that of the dopant of the second conductive semiconductor layer 7.

The electrons from the first conductive semiconductor layer 3 and the holes from the second conductive semiconductor layer 7 may be recombined in the active layer 5. Due to the recombination of the electrons and holes, light having a wavelength corresponding to the energy band gap determined according to a material constituting the active layer 5 can be emitted. The active layer 5 may generate one of ultraviolet ray, visible ray and infrared ray. Another compound semiconductor layer may be disposed on the first conductive semiconductor layer 3 or under the second conductive semiconductor layer 7 in the form of a single layer or a multi-layer, but the embodiment is not limited thereto.

The current spreading layer 43 may be disposed under the light emitting structure 9. The current spreading layer 43 is substantially identical to the current spreading layer 13 according to the first embodiment, so detailed description thereof will be omitted. The current may rapidly spread over the whole area of the current spreading layer 43 so that the current may be uniformly supplied to the second conductive semiconductor layer 7 that makes contact with the whole area of the current spreading layer 43. In addition, the current spreading layer 43 may rapidly dissipate heat generated from the light emitting structure 9 to the outside.

The wavelength conversion structures 51 may be disposed in the current spreading layer 43. The wavelength conversion structures 51 are substantially identical to the wavelength conversion structures 21 according to the first embodiment, so detailed description thereof will be omitted. The wavelength conversion structures may have mutually different diameters. Each of the wavelength conversion structures having mutually different diameters can convert light generated from the light emitting structure 9 such that the light may have mutually different wavelengths. Reference numerals 45, 47 and 49 may represent first wavelength conversion structures having a first diameter D1, second wavelength conversion structures having a second diameter D2, and third wavelength conversion structures having a third diameter D3, respectively.

The electrode layer 53 may be disposed under the current spreading layer 43. The electrode layer 53 may be an electrode to supply current. The electrode layer 53 may be a reflective layer including a reflective material. The electrode layer 53 may reflect light, which is generated from the light emitting structure and passes through the current spreading layer 43, so that the light extraction efficiency can be improved. The electrode layer 53 may include at least one of an electrode and a reflective layer. The electrode layer 53 may have a single layer structure or a multi-layer structure. The electrode layer 53 may be an alloy layer including at least one material.

A first electrode 55 may be disposed on a portion of a bottom surface of the first conductive semiconductor layer 3. A second electrode 57 may be disposed on a portion of a bottom surface of the reflective layer. The first and second electrodes 55 and 57 may include at least one selected from the group consisting of Au, Ti, Ni, Cu, Al, Cr, Ag and Pt. The first electrode 55 may be a reflective layer to reflect light, but the embodiment is not limited thereto. The first electrode 55 may have a multi-layer structure and at least one layer of the multi-layer structure may serve as a reflective layer, but the embodiment is not limited thereto. For instance, the first electrode 55 may include an adhesive layer, a reflective layer, a diffusion barrier layer, an electrode layer, and an electrode bonding layer, but the embodiment is not limited thereto. For instance, the second electrode 57 may consist of layers constituting the first electrode 55 except for the reflective layer, but the embodiment is not limited thereto.

Figure 12:
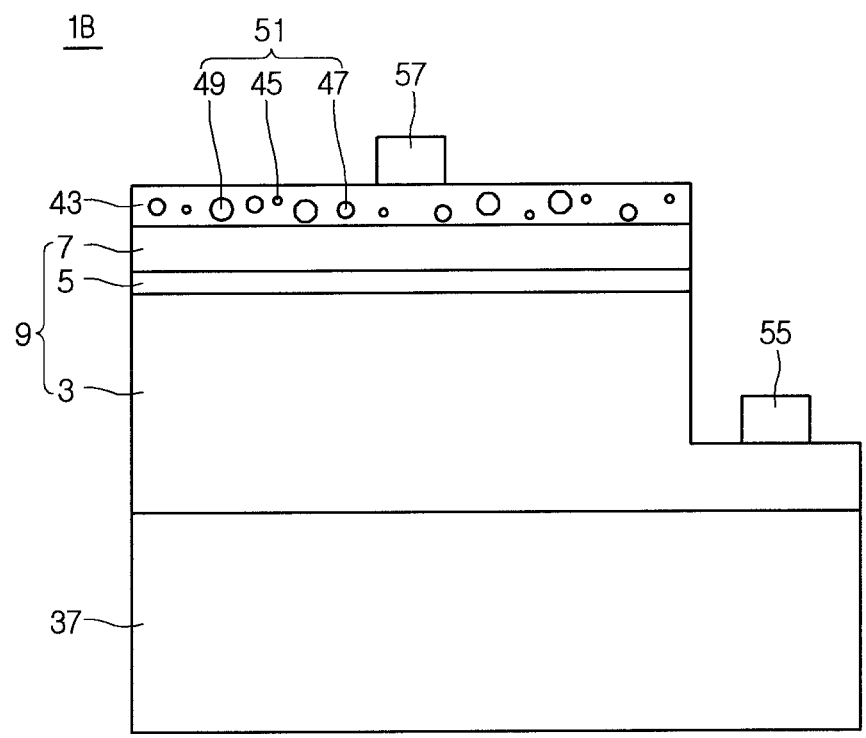
FIG. 12 is a sectional view showing a light emitting device according to a third embodiment.

FIG. 12 is a sectional view showing a light emitting device according to a third embodiment. The light emitting device 1B according to the third embodiment may be a lateral type light emitting device. The light emitting device 1B according to the third embodiment may have a structure corresponding to the structure of the light emitting device LA according to the second embodiment if the electrode layer 53 is removed and the structure is turned over at an angle of 180°. That is, if the electrode layer 53 is added the light emitting device 1B according to the third embodiment in a state that the structure is turned over at an angle of 180°, the light emitting device 1A according to the second embodiment may be obtained, but the embodiment is not limited thereto. Thus, in the following description of the third embodiment, materials and/or elements having the same function and same shape as those of the second embodiment will not be described in detail.

Referring to FIG. 12, the light emitting device 1B according to the third embodiment may include a growth substrate 37, a light emitting structure 9, a current spreading layer 43, a plurality of wavelength conversion structures 51, and first and second electrodes.

The light emitting structure 9 may include at least the first conductive semiconductor layer 3, the active layer 5 and the second conductive semiconductor layer 7, but the embodiment is not limited thereto. The first conductive semiconductor layer 3 may be disposed on the growth substrate 37. The active layer 5 may be disposed on the first conductive semiconductor layer 3 and the second conductive semiconductor layer 7 may be disposed on the active layer 5.

The current spreading layer 43 may be disposed on the second conductive semiconductor layer 7 and the wavelength conversion structures 51 may be disposed on the current spreading layer 43. The first electrode may be disposed on a portion of a top surface of the first conductive semiconductor layer 3, and the second electrode may be disposed on a portion of a top surface of the second conductive semiconductor layer 7. Light generated from the light emitting structure 9 may be emitted to the outside through the current spreading layer 43.

Current supplied to the second electrode may be spread over the whole area of the current spreading layer 43 and then supplied to the second conductive semiconductor layer 7, so that the light efficiency can be improved due to the spread current. The light generated from the light emitting structure 9 may be converted into light having mutually different wavelengths due to the wavelength conversion structures 51 having mutually different diameters, so light having a plurality of wavelengths can be generated from the single light emitting device 1B, so that the white light can be reproduced.

Figure 13:
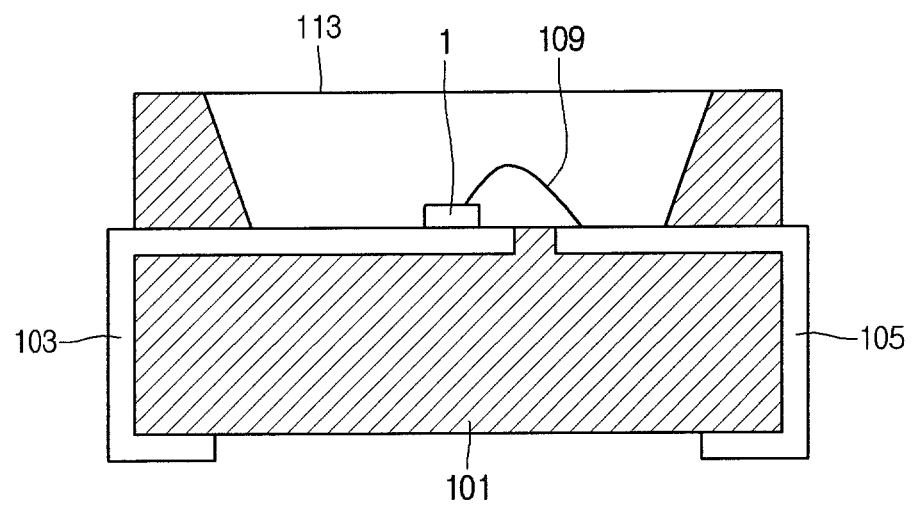
FIG. 13 is a sectional view showing a light emitting device package according to an embodiment.

FIG. 13 is a sectional view showing a light emitting device package according to the embodiment. Referring to FIG. 13, the light emitting device package according to the embodiment may include a package body 101, first and second electrode layers 103 and 105 installed in the package body 101, a light emitting device 1 according to the first embodiment or the second embodiment to receive power from the first and second electrode layers 103 and 105, and a molding member 113 to surround the light emitting device 1.

The package body 101 may include a silicon material, a synthetic resin material, or a metallic material, and inclined surfaces may be formed around the light emitting device 1. The first and second electrode layers 103 and 105 may be electrically insulated from each other to supply power to the light emitting device 1. In addition, the first and second electrode layers 103 and 105 may reflect light generated from the light emitting device 1 to improve the light efficiency, and discharge the heat generated from the light emitting device 1 to the outside. The light emitting device 1 may be installed in one of the first electrode layer 103, the second electrode layer 105, and the package body 101, and may be electrically connected to the first and second electrode layers 103 and 105 through a wire scheme or a die bonding scheme, but the embodiment is not limited thereto.

According to the embodiment, although the light emitting device 1 is electrically connected to one of the first and second electrode layers 103 and 105 through one wire 109 for the illustrative purpose, the embodiment is not limited thereto. In other words, the light emitting device 1 may be electrically connected to the first and second electrode layers 103 and 105 by using two wires. Alternatively, the light emitting device 1 may be electrically connected to the first and second electrode layers 103 and 105 without a wire.

The molding member 113 may surround the light emitting device 1 to protect the light emitting device 1. In addition, the molding member 113 may include phosphors to convert the wavelength of light emitted from the light emitting device 1. The light emitting device package according to the embodiment may include a chip on board (COB) type, the top surface of the package body 101 may be flat, and a plurality of light emitting devices may be installed in the package body 101.

The light emitting device or the light emitting device package according to the embodiment may be applicable to the light unit. The light unit is applicable to a display device or a lighting device such as a unit including a lighting lamp, a signal lamp, a headlight of a vehicle, or an indication lamp.

The embodiments provide a light emitting device capable of improving light extraction efficiency.

The embodiments provide a light emitting device capable of generating light having a plurality of wavelengths different from each other.

According to the embodiment, there is provided a light emitting device including a light emitting structure including a plurality of compound semiconductor layers; a current spreading layer under the light emitting structure; a plurality of wavelength conversion structures in the current spreading layer; an electrode layer under the current spreading layer; and an electrode on the light emitting structure.

According to the embodiment, there is provided a light emitting device including a substrate; a light emitting structure including a plurality of compound semiconductor layers on the substrate; a current spreading layer on the light emitting structure; and a plurality of wavelength conversion structures in the current spreading layer.

According to the embodiment, there is provided a light emitting device including a substrate; a light emitting structure including a plurality of compound semiconductor layers under the substrate; a current spreading layer under the light emitting structure; a plurality of wavelength conversion structures in the current spreading layer; and an electrode layer under the current spreading layer.

According to the embodiment, a light emitting device package may include the light emitting device.

According to the embodiment, light having a blue wavelength, light having a green wavelength, and light having a red wavelength can be generated by a plurality of wavelength conversion structures, so an additional phosphor is not necessary, so that the color rendering index (CRI) can be improved.

According to the embodiment, an occupying area of the light emitting device can be reduced as compared with the light emitting device according to the related art which generates one light, and the manufacturing cost can be reduced.

According to the embodiment, a current spreading layer including a graphene sheet is provided, so that the current spreading effect can be achieved and the heat dissipation efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure having an active layer between first and second semiconductor layers;
    a channel layer under a peripheral region of the light emitting structure;
    a single current spreading layer under the light emitting structure and having graphene and a plurality of wavelength conversion structures, wherein the single current spreading layer having the graphene and the wavelength conversion structures directly contacts a lower surface of the second semiconductor layer and a bottom surface of the channel layer, wherein the wavelength conversion structures within the single current spreading layer have a core-shell structure;
    an electrode layer that directly contacts the single current spreading layer having the graphene and the wavelength conversion structures, the electrode layer having a topmost surface and a lowermost surface;
    an adhesive layer that directly contacts the electrode layer; and
    an electrode on the light emitting structure, wherein the adhesive layer has a top surface at an area that is vertically aligned with the electrode, and the top surface of the adhesive layer is closer to the lower surface of the second semiconductor layer than the lowermost surface of the electrode layer.

2. The light emitting device of claim 1, further comprising:
    a support member under the adhesive layer.

3. The light emitting device of claim 2, wherein the adhesive layer surrounds at least one of the current spreading layer and the electrode layer.

4. The light emitting device of claim 1, wherein the current spreading layer overlaps with a portion of the channel layer.

5. The light emitting device of claim 1, wherein the wavelength conversion structures are surrounded by the current spreading layer.

6. The light emitting device of claim 1, wherein the wavelength conversion structures within the current spreading layer have mutually different diameters.

7. The light emitting device of claim 6, wherein light from the wavelength conversion structures have different wavelengths.

8. The light emitting device of claim 6, wherein the light emitting structure generates ultraviolet ray and the ultraviolet ray is converted into visible ray having wavelengths different from each other by the wavelength conversion structures.

9. The light emitting device of claim 1, wherein the electrode layer includes at least one of an electrode and a reflective layer.

10. The light emitting device of claim 9, wherein the electrode comprising at least one selected from the group consisting of Au, Ti, Ni, Cu, Al, Cr, Ag and Pt.

11. The light emitting device of claim 9, wherein the reflective layer comprising at least one or two selected from the group consisting of Ag, Ni, Al, Rh, Pd, Ir, Ru, Mg, Zn, Pt, Au and Hf.

12. The light emitting device of claim 1, wherein the wavelength conversion structures include one of CdSe, CdSe/ZnS, CdTe/CdS, PbS and PuSe.

13. The light emitting device of claim 1, wherein the channel layer includes at least one selected from the group consisting of $SiO_2$, $SiO_x$, $SiO_xN_y$, $Si_3N_4$, and $Al_2O_3$.

14. The light emitting device of claim 1, further comprising a protective layer on the light emitting structure.

15. The light emitting device of claim 14, wherein the protective layer is disposed on at least a lateral side of the light emitting structure.

16. The light emitting device of claim 1, further comprising a light extracting structure disposed on a top surface of the first conductive semiconductor layer.

17. The light emitting device of claim 16, wherein the light extracting structure comprise a roughness or a convex-concavo structure.

18. A light emitting device comprising:
a light emitting structure having an active layer between first and second semiconductor layers;
a channel layer under a peripheral region of the light emitting structure, the channel layer having a bottom surface that includes a first area and a second area;
a single current spreading layer under the light emitting structure, the single current spreading layer having graphene and a plurality of wavelength conversion structures, the single current spreading layer having the graphene and the wavelength conversion structures directly contacts a bottom surface of the second semiconductor layer and the first area of the bottom surface of the channel layer, wherein the wavelength conversion structures within the single current spreading layer have a core-shell structure;
an electrode layer that directly contacts the single current spreading layer having the graphene and the wavelength conversion structures, the electrode layer having a topmost surface and a lowermost surface;
an adhesive layer under the electrode layer, the adhesive layer in direct contact with the electrode layer and in direct contact with the second area of the bottom surface of the channel layer; and
an electrode on the light emitting structure, wherein the adhesive layer has a top surface at an area that is vertically aligned with the electrode, and the top surface of the adhesive layer is closer to the bottom surface of the second semiconductor layer than the lowermost surface of the electrode layer.

19. The light emitting device of claim 18, wherein an area of the electrode layer is equal to an area of the current spreading layer.

* * * * *